US012595979B2

(12) United States Patent
Naito et al.

(10) Patent No.: US 12,595,979 B2
(45) Date of Patent: Apr. 7, 2026

(54) HEAT CONDUCTION FILM AND HEAT-DISSIPATING STRUCTURE USING SAME

(71) Applicant: NISSAN MOTOR CO., LTD., Yokohama (JP)

(72) Inventors: Tetsuro Naito, Kanagawa (JP); Yoshiko Tsukada, Kanagawa (JP); Takako Kaneko, Kanagawa (JP); Atsuhiko Yajima, Kanagawa (JP); Kazuyuki Shiratori, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 197 days.

(21) Appl. No.: 18/563,626

(22) PCT Filed: May 26, 2021

(86) PCT No.: PCT/JP2021/020008
§ 371 (c)(1),
(2) Date: Nov. 22, 2023

(87) PCT Pub. No.: WO2022/249338
PCT Pub. Date: Dec. 1, 2022

(65) Prior Publication Data
US 2024/0230252 A1 Jul. 11, 2024

(51) Int. Cl.
*H05K 7/20* (2006.01)
*C08J 5/18* (2006.01)
(Continued)

(52) U.S. Cl.
CPC ................ *F28F 21/02* (2013.01); *C08J 5/18* (2013.01); *C09K 5/14* (2013.01); *H05K 7/2039* (2013.01);
(Continued)

(58) Field of Classification Search
CPC .......... F28F 21/02; C08J 5/18; C08J 2309/06; C08J 5/042; C08J 5/045; C08J 7/044;
(Continued)

(56) References Cited

U.S. PATENT DOCUMENTS 9,363,932 B2 6/2016 Wang et al.
9,487,690 B2 11/2016 Tanaka et al.
(Continued)

FOREIGN PATENT DOCUMENTS

JP 2019-137577 A1 8/2019
WO WO-2013/099089 A1 7/2013
(Continued)

OTHER PUBLICATIONS

Maeda WO 2020194972 A1 translation.*
(Continued)

*Primary Examiner* — Jacob R Crum
(74) *Attorney, Agent, or Firm* — Foley & Lardner LLP

(57) ABSTRACT

Provided is a means capable of selectively improving thermal conductivity in a surface direction of a heat conduction sheet.

A heat conduction film is configured by disposing a scale-like carbon material formed of a plurality of graphene layers and a binder such that adjacent scale-like carbon materials are in contact with each other and a long axis of the scale-like carbon material is oriented in plane direction of the film, and further making at least a part of a minor diameter of the binder or a minor diameter of a void formed by the scale-like carbon material and the binder smaller than a minor diameter of the scale-like carbon material.

13 Claims, 2 Drawing Sheets

(51) Int. Cl.

| | |
|---|---|
| ***C09K 5/14*** | (2006.01) |
| ***F28F 21/02*** | (2006.01) |
| ***H10H 20/858*** | (2025.01) |
| *C08K 3/04* | (2006.01) |
| *C08K 7/00* | (2006.01) |

(52) U.S. Cl.
CPC .... *H10H 20/8581* (2025.01); *H10H 20/8583* (2025.01); *C08J 2309/06* (2013.01); *C08K 3/042* (2017.05); *C08K 7/00* (2013.01)

(58) Field of Classification Search
CPC .... C09K 5/14; H05K 7/2039; H10H 20/8581; H10H 20/8583; C08K 3/042; C08K 7/00; F21V 29/85; H01L 23/3733; H01L 23/3737; H01L 23/373
See application file for complete search history.

(56) References Cited

U.S. PATENT DOCUMENTS

| | | | | |
|---|---|---|---|---|
| 10,566,482 | B2 * | 2/2020 | Zhamu | H10F 77/63 |
| 11,084,925 | B2 | 8/2021 | Kim | |
| 2015/0030835 | A1 | 1/2015 | Tanaka et al. | |
| 2015/0118482 | A1 | 4/2015 | Kagawa | |
| 2015/0257251 | A1 | 9/2015 | Kagawa | |
| 2015/0330724 | A1 | 11/2015 | Tanaka et al. | |
| 2017/0009045 | A1 | 1/2017 | Sawa et al. | |
| 2017/0167716 | A1 * | 6/2017 | Ezaki | F21V 29/87 |
| 2018/0231337 | A1 | 8/2018 | Ito et al. | |
| 2019/0080978 | A1 * | 3/2019 | Kumura | H01L 23/373 |
| 2019/0176448 | A1 | 6/2019 | Mukohata et al. | |
| 2019/0241435 | A1 | 8/2019 | Muramatsu et al. | |
| 2019/0387586 | A1 * | 12/2019 | Buzzi | H05B 6/642 |
| 2020/0350229 | A1 * | 11/2020 | Chang | H05K 7/20309 |
| 2022/0165457 | A1 | 5/2022 | Maeda et al. | |
| 2022/0336834 | A1 | 10/2022 | Minamiura et al. | |
| 2024/0417577 | A1 | 12/2024 | Kato et al. | |

FOREIGN PATENT DOCUMENTS

| | | | |
|---|---|---|---|
| WO | WO-2018/030430 | A1 | 2/2018 |
| WO | WO-2020/194972 | A1 | 10/2020 |

OTHER PUBLICATIONS

Office Action issued in EP Appl. No. 21942156.7 dated Feb. 27, 2025.

Non-Final Office Action in U.S. Appl. No. 18/563,541 dated Jun. 26, 2025.

What is Flake Graphite? Properties, Uses, and Benefits Explained; KDM FAB; https://kdmfab.com/flake-graphite/ (Year: 2024).

Final Office Action on U.S. Appl. No. 18/563,541 dated Nov. 4, 2025.

* cited by examiner

[FIG. 1]
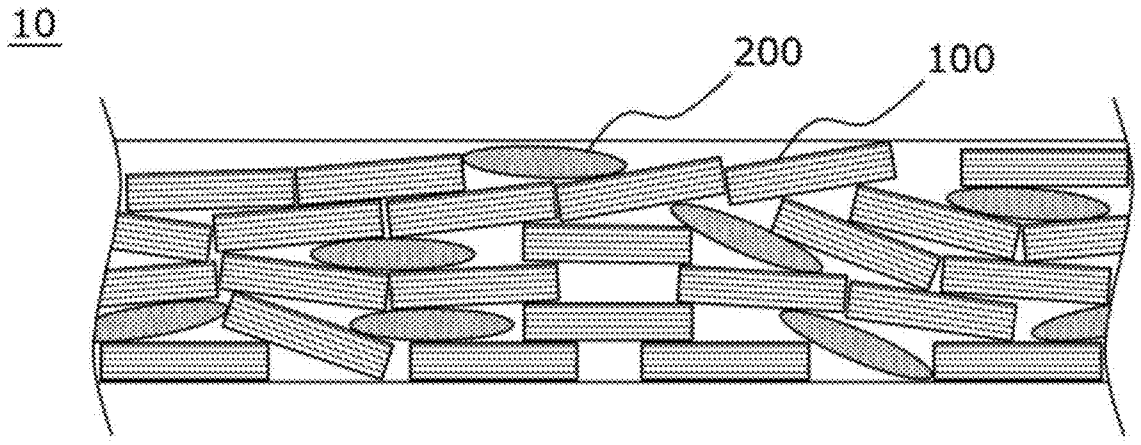
[FIG. 2]
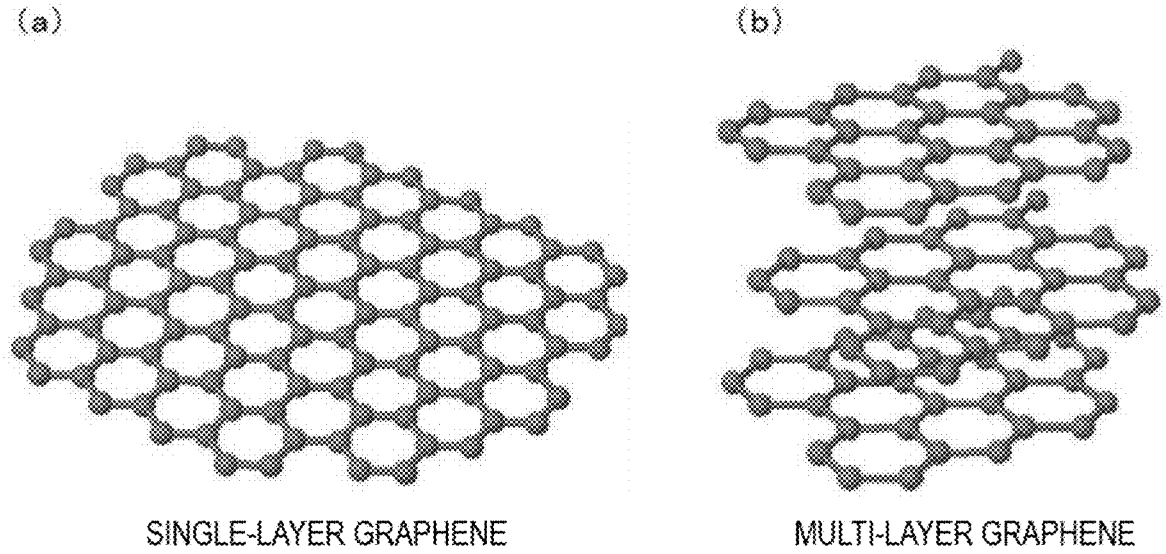

[FIG. 3]
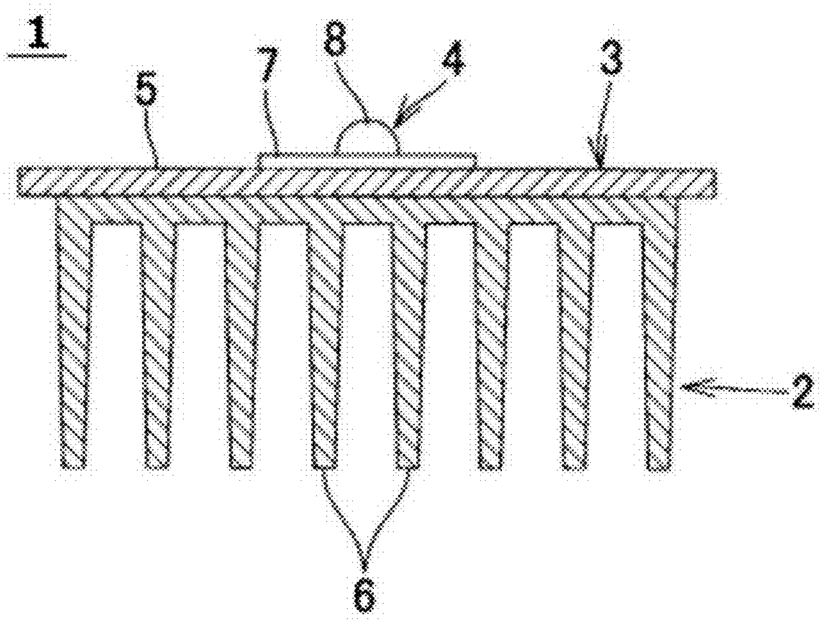
[FIG. 4]
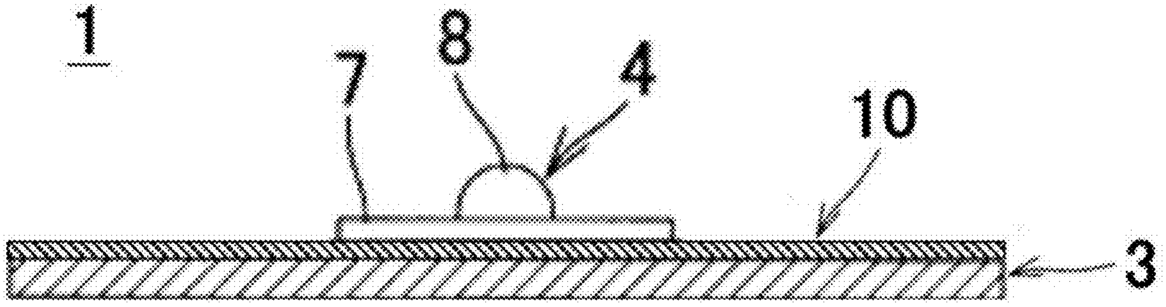

HEAT CONDUCTION FILM AND HEAT-DISSIPATING STRUCTURE USING SAME

TECHNICAL FIELD

The present invention relates to a heat conduction film and a heat-dissipating structure using the same.

BACKGROUND ART

In a semiconductor element mounted on various electronic devices such as a personal computer, a light-emitting diode (LED) light source, a thin display, and other devices, driving thereof results in heat generation, and accumulation of the generated heat has an adverse effect on the driving of the semiconductor element and peripheral devices. Furthermore, along with the progress of IoT, the development of high-speed communications networks, the increasing intelligence of various devices, and the like, there has been a high demand for realization of efficient dissipation of heat from electronic devices. Similarly, also with regard to a secondary battery as a power source for driving a motor intended to be mounted on a vehicle, from the viewpoint of increasing the capacity of the secondary battery, space-saving at the time of being mounted on the vehicle, and the like, there has still been an increasing demand for efficient dissipation of heat generated at the time of driving the secondary battery.

Various cooling means are used for the purpose of dissipating heat generated by driving various electronic devices or a power source for driving the motor as described above. For example, as a method of cooling an electronic component such as a semiconductor element, a method of cooling air in a device housing by attaching a fan to the device, a method of attaching a heat sink such as a heat-dissipating fin or a heat-dissipating plate to the semiconductor element to be cooled, or the like is used. In addition to cooling using a cooling medium such as air or water, cooling using a fan or a heat sink as described above is also performed to cool the power source for driving the motor.

In the related art, in a case where cooling is performed by attaching the heat sink to the semiconductor element, there is proposed a technique of providing a heat conduction sheet between a semiconductor element and a heat sink in order to efficiently release heat of the semiconductor element. As such a heat conduction sheet, for example, WO 2018/030430 A discloses a heat conduction sheet having a structure in which a plurality of resin layers including a thermally conductive resin layer that contains a heat conductive plate-like filler (such as boron nitride or flaked graphite) is laminated, and configured such that when a surface perpendicular to the laminated surface serves as a sheet surface; and the long axis of the thermally conductive plate-shaped filler is oriented at an angle of 60° or more to the sheet surface. According to the disclosure of WO 2018/030430 A, with the above-described configuration, it is possible to realize a heat conduction sheet in which the thermal conductivity of the heat conduction sheet is improved while suppressing the amount of the heat conductive plate-like filler to be used.

SUMMARY OF INVENTION

Technical Problem

As can be seen from the fact that the thermal conductivity of the heat conduction sheet disclosed in WO 2018/030430 A in the thickness direction is 3 W/m·K or more, it is intended to efficiently realize thermal conduction exclusively in the thickness direction of the heat conduction sheet. Such a heat conduction sheet is effective as the heat conduction sheet provided between the semiconductor element and the heat sink as described above. However, since the heat conductive plate-like filler is configured such that the long axis thereof is oriented at an angle of 60 to 90° to the sheet surface in the heat conduction sheet, the thermal conductivity in the plane direction of the heat conduction sheet is extremely low. Therefore, the heat conduction sheet cannot be used for a heat-dissipating structure that requires heat dissipation in the plane direction of the heat conduction sheet.

Therefore, an object of the present invention is to provide a means capable of selectively improving thermal conductivity in a plane direction of a heat conduction sheet.

Solution to Problem

The present inventors have carried out a diligent study in view of the problem described above. As a result, the present inventors have found that a heat conduction film is configured by disposing a scale-like carbon material formed of a plurality of graphene layers such that the adjacent scale-like carbon materials are in contact with each other and the long axis of the scale-like carbon material is oriented in plane direction of the film, and a size of a minor diameter of the binder or a minor diameter of a void formed by the scale-like carbon material and the binder is controlled, whereby the above problem can be solved, and they have completed the present invention.

According to one aspect of the present invention, there is provided a heat conduction film including: a scale-like carbon material formed of a plurality of graphene layers; and a binder, in which the adjacent scale-like carbon materials are in contact with each other, and the scale-like carbon material is disposed such that a long axis of the scale-like carbon material is oriented in plane direction of the film, and at least a part of a minor diameter of the binder or a minor diameter of a void formed by the scale-like carbon material and the binder is smaller than a minor diameter of the scale-like carbon material.

BRIEF DESCRIPTION OF DRAWINGS

FIG. 1 is a schematic cross-sectional view schematically illustrating a cross section of a heat conduction film according to one embodiment of the present invention.

FIG. 2 is an explanatory view for explaining the structures of (a) single-layer graphene (graphene sheet) and (b) multilayer graphene.

FIG. 3 is a schematic cross-sectional view schematically illustrating a cross section of a heat-dissipating structure according to a conventional technique.

FIG. 4 is a schematic cross-sectional view schematically illustrating a cross section of a heat-dissipating structure according to one embodiment of the present invention.

DESCRIPTION OF EMBODIMENTS

<<Heat Conduction Film>>

One aspect of the present invention is a heat conduction film including: a scale-like carbon material formed of a plurality of graphene layers; and a binder, in which the adjacent scale-like carbon materials are in contact with each other, and the scale-like carbon material is disposed such that a long axis of the scale-like carbon material is oriented in plane direction of the film, and at least a part of a minor diameter of the binder or a minor diameter of a void formed by the scale-like carbon material and the binder is smaller than a minor diameter of the scale-like carbon material. According to the heat conduction film according to the present aspect, there is provided a heat conduction film excellent in selective thermal conductivity in a surface direction.

Hereinafter, the embodiments of the heat conduction film according to the present aspect will be described with reference to the drawings, but the technical scope of the present invention should be determined based on the description of the claims, and is not limited to the following embodiments. The dimensional ratios of the drawings are exaggerated for convenience of description and may differ from the actual ratios.

FIG. 1 is a schematic cross-sectional view schematically illustrating a cross section of a heat conduction film according to one embodiment of the present invention.

As illustrated in FIG. 1, a heat conduction film 10 according to one embodiment of the present invention contains a large number of multi-layer graphenes 100, which are one kind of scale-like carbon material. Further, the heat conduction film 10 also contains a binder 200. Here, the adjacent multi-layer graphenes 100 are in contact with each other. The multi-layer graphene 100 is disposed such that a long axis of the multi-layer graphene 100 is oriented in plane direction of the film. The minor diameter of the binder 200 is smaller than a minor diameter of a multi-layer graphene 100 (scale-like carbon material). Further, the minor diameter of the void formed by the multi-layer graphene 100 (scale-like carbon material) and the binder 200 is also smaller than the minor diameter of the multi-layer graphene 100 (scale-like carbon material).

The multi-layer graphene 100 included in the heat conduction film 10 having the configuration as illustrated in FIG. 1 has a structure (FIG. 2(*b*)) in which a plurality of single-layer graphenes (graphene sheets) illustrated in FIG. 2(*a*) is laminated in parallel. Since the graphene sheet has a structure in which carbon atoms with sp2 hybrid orbitals (sp2 carbon) are connected in a honeycomb structure in a two-dimensional direction, the graphene sheet has a characteristic that the thermal conductivity in the plane direction is extremely high. As a result, the heat conduction film 10 illustrated in FIG. 1 is also disposed such that the adjacent multi-layer graphenes 100 are in contact with each other and the long axis of the multi-layer graphene 100 is oriented in the plane direction of the film, and thus the thermal conductivity in the plane direction of the film is very high. In other words, it can also be said that the thermal conductivity of the heat conduction film 10 illustrated in FIG. 1 in the plane direction of the film is selectively increased with respect to the thermal conductivity in the thickness direction (direction perpendicular to the plane direction) of the film.

In addition, in the heat conduction film 10 illustrated in FIG. 1, the minor diameter of the binder 200 and the minor diameter of the void formed by the multi-layer graphene 100 (scale-like carbon material) and the binder 200 are smaller than the minor diameter of the multi-layer graphene 100 (scale-like carbon material). With such a configuration, disturbance in a state in which the long axis of the multi-layer graphene 100 (scale-like carbon material) is oriented in the plane direction of the film is suppressed to the minimum. This can result in suppression of a decrease in selective thermal conductivity in the plane direction of the film, which is achieved by orienting the long axis of the multi-layer graphene 100 (scale-like carbon material) in the plane direction of the film. Further, addition of a binder while suppressing the disturbance of the orientation of the multi-layer graphene 100 (scale-like carbon material) prevents falling of the multi-layer graphene 100 (scale-like carbon material) from the heat conduction film 10, and prevents peeling of the adjacent multi-layer graphenes 100 (scale-like carbon material) inside the heat conduction film 10. Furthermore, the amount of voids, which is also a factor that deteriorates the thermal conductivity, can also be reduced. As a result of these, there is an advantage that selective thermal conductivity in the plane direction of the heat conduction film 10 can be further improved.

Hereinafter, a material constituting the heat conduction film according to the present aspect will be described.

[Scale-Like Carbon Material]

The heat conduction film according to the present aspect includes a scale-like carbon material formed of a plurality of graphene layers. The "scale-like carbon material" used herein means a carbon material having a scale-like shape. This scale-like carbon material is formed of a plurality of graphene layers, but the number of laminated graphene layers is not particularly limited, and can be appropriately set within a range of securing a scale-like shape. Note that, in the present specification, a scale-like carbon material having up to 10 graphene layers is referred to as "graphene". Among the graphenes, the graphene in which the number of laminated graphene layers is 1 is referred to as "single-layer graphene", and the graphene in which the number of laminated graphene layers is from 2 to 10 is referred to as "multi-layer graphene". Then, the scale-like carbon material in which the number of laminated graphene layers is 11 or more is referred to as "graphite".

As one example, the number of laminated graphene layers in the scale-like carbon material is preferably 2 to 100, more preferably 2 to 50, still more preferably 2 to 20, and particularly preferably 2 to 10. Therefore, in the heat conduction film according to the present aspect, the scale-like carbon material is preferably multi-layer graphene or graphite, and more preferably multi-layer graphene. As described above, the multi-layer graphene or graphite has a characteristic of being particularly excellent in thermal conductivity in the plane direction, and the multi-layer graphene is suitably used in the heat conduction film according to the present aspect because the multi-layer graphene is available at low cost. Note that, as the scale-like carbon material, only one kind thereof may be used alone, or two or more kinds thereof may be used in combination.

As described above, since the scale-like carbon material has a scale-like shape, there is anisotropy in the size. In the present specification, when a surface having the largest area among surfaces constituting the surface of the scale-like carbon material is defined as an XY plane surface, the longest line segment among line segments connecting any two points on the contour of the scale-like carbon material in the XY plane is defined as a major diameter of the scale-like carbon material. The value of the average major diameter of the scale-like carbon material is not particularly limited, but is preferably 0.1 to 1000 μm, more preferably 0.1 to 500 μm, and still more preferably 0.1 to 100 μm. The value of the average major diameter of the scale-like carbon material means an arithmetic average diameter of major diameters of several tens of scale-like carbon materials included in the heat conduction film.

In the present specification, when a surface having the largest area among surfaces constituting the surface of the scale-like carbon material is defined as an XY plane surface, the maximum dimension of the side constituting an XZ plane surface or a YZ plane surface is defined as a minor diameter of the scale-like carbon material. The value of the average minor diameter of the scale-like carbon material is not particularly limited, but is preferably 0.6 to 30 nm, more preferably 0.6 to 15 nm, and still more preferably 0.6 to 3 nm. The value of the average minor diameter of the scale-like carbon material means an arithmetic average value of minor diameters of several tens of scale-like carbon materials included in the heat conduction film.

Then, the value of the ratio of the major diameter to the minor diameter of the scale-like carbon material obtained as described above is defined as an aspect ratio. The value of the average aspect ratio of the scale-like carbon material is not particularly limited, but is preferably more than 1 and 2,000,000 or less, more preferably 5 to 900,000, and still more preferably 30 to 200,000. The value of the average aspect ratio of the scale-like carbon material means an arithmetic average value of the aspect ratios of several tens of scale-like carbon materials included in the heat conduction film.

As the scale-like carbon material, a commercially available product or a processed product obtained by processing a commercially available product may be used, or a material prepared on your own may be used. Since the method of producing the multi-layer graphene or graphite as described above is widely known, detailed description thereof is omitted here. In recent years, a technique capable of mass-producing a scale-like carbon material, like multi-layer graphene, at low cost has been developed, and the procurement cost of the scale-like carbon material has also been reduced. Therefore, according to the present aspect, it can be said that the heat conduction film having excellent thermal conductivity in a plane direction can be produced at low cost, which is also highly advantageous. Note that there has not been a technique capable of producing a scale-like carbon material at such a low cost heretofore, and thus it is considered that there has not been a motivation to dispose the scale-like carbon material so as to be oriented in the plane direction of the film to produce a heat conduction film having excellent thermal conductivity in the plane direction in the conventional technique.

The content of the scale-like carbon material in the heat conduction film is not particularly limited, but is preferably 5 to 90 mass %, more preferably 10 to 90 mass %, and still more preferably 15 to 90 mass % with respect to 100 mass % of the total amount of the constituents of the heat conduction film.

[Binder]

The heat conduction film according to the present aspect essentially contains a binder in addition to the scale-like carbon material. The binder is used for the purpose of improving the formability of a coating film during production of a heat conduction film, improving the binding property of various components, protecting the various components, and the like. In particular, when the heat conduction film contains the binder, the scale-like carbon materials contained in the heat conduction film are firmly bonded to each other. Therefore, the mechanical strength of the heat conduction film is improved, and the thermally conductive network formed of the scale-like carbon material is hardly cut. As a result, a decrease in the thermal conductivity in the surface direction during long-term use is suppressed to the minimum, and a heat conduction film having excellent durability is provided.

Examples of the binder include thermoplastic polymers such as polybutylene terephthalate, polyethylene terephthalate, polyvinylidene fluoride (PVDF) (including a compound in which a hydrogen atom is substituted with another halogen element), polyethylene, polypropylene, polymethylpentene, polybutene, polyether nitrile, polytetrafluoroethylene, polyacrylonitrile, polyimide, polyamide, an ethylene-vinyl acetate copolymer, polyvinyl chloride, styrene-butadiene rubber (SBR), an ethylene-propylene-diene copolymer, a styrene-butadiene-styrene block copolymer and a hydrogenated product thereof, a styrene-isoprene-styrene block copolymer and a hydrogenated product thereof; fluorine resins such as a tetrafluoroethylene-hexafluoropropylene copolymer (FEP), a tetrafluoroethylene-perfluoroalkylvinylether copolymer (PFA), an ethylene-tetrafluoroethylene copolymer (ETFE), polychlorotrifluoroethylene (PCTFE), an ethylene-chlorotrifluoroethylene copolymer (ECTFE), and polyvinyl fluoride (PVF); and vinylidene fluoride-based fluorine rubber such as vinylidene fluoride-hexafluoropropylene-based fluorine rubber (VDF-HFP-based fluorine rubber), vinylidene fluoride-hexafluoropropylene-tetrafluoroethylene-based fluorine rubber (VDF-HFP-TFE-based fluorine rubber), vinylidene fluoride-pentafluoropropylene-based fluorine rubber (VDF-PFP-based fluorine rubber), vinylidene fluoride-pentafluoropropylene-tetrafluoroethylene-based fluorine rubber (VDF-PFP-TFE-based fluorine rubber), vinylidene fluoride-perfluoromethylvinylether-tetrafluoroethylene-based fluorine rubber (VDF-PFMVE-TFE-based fluorine rubber), vinylidene fluoride-chlorotrifluoroethylene-based fluorine rubber (VDF-CTFE-based fluorine rubber); and epoxy resins. Above all, polyimide, styrene-butadiene rubber, carboxymethylcellulose, polypropylene, polytetrafluoroethylene, polyacrylonitrile, and polyamide are more preferably used.

The content of the binder in the heat conduction film is not particularly limited, but a resin binder is usually used as the binder as described above. However, the thermal conductive characteristics of the resin binder are generally low. Therefore, when the heat conduction film according to the present aspect is formed, the addition of the binder increases the thermal resistance and causes inhibition of the thermal conduction. From such a viewpoint, the content of the binder is preferably 50 mass % or less, more preferably 1 to 40 mass %, still more preferably 5 to 35 mass %, and particularly preferably 5 to 30 mass with respect to 100 mass % of the total amount of the constituents of the heat conduction film.

[Other Components]

The heat conduction film according to the present aspect essentially contains a scale-like carbon material and a binder, but may further contain other components. Examples of such other components include a thermally conductive filler other than the scale-like carbon material, a thickener, and the like.

Examples of the thermally conductive filler other than the scale-like carbon material include a carbon material, a carbide, a nitride, an oxide, a hydroxide, a metal, and the like. Examples of the carbon material include carbon black, diamond, fullerene, carbon nanotube, carbon nanofiber (vapor grown carbon fiber (VGCF or the like)), carbon nanohorn, carbon microcoil, carbon nanocoil, and the like. Examples of the carbide include silicon carbide, boron carbide, aluminum carbide, titanium carbide, tungsten carbide, and the like. Examples of the nitride include silicon nitride, boron nitride, aluminum nitride, gallium nitride, chromium nitride, tungsten nitride, magnesium nitride, molybdenum nitride, lithium nitride, and the like. Examples of the oxide include iron oxide, silicon oxide (silica), aluminum oxide (alumina) (including a hydrate of aluminum oxide (boehmite or the like)), magnesium oxide, titanium oxide, cerium oxide, zirconium oxide, and the like. Examples of the oxide include transition metal oxides such as barium titanate, and further include oxides doped with metal ions, e.g. indium tin oxide and antimony tin oxide, and the like. Examples of the hydroxide include aluminum hydroxide, calcium hydroxide, magnesium hydroxide, and the like. Examples of the metal include copper, gold, nickel, tin, iron, and alloys thereof, and the like.

The content of the thermally conductive filler other than the scale-like carbon material in the heat conduction film is not particularly limited, but is preferably 1 to 50 mass %, more preferably 5 to 45 mass, and still more preferably 10 to 40 mass % with respect to 100 mass % of the total amount of the constituents of the heat conduction film. Further, the total content of the scale-like carbon material and the thermally conductive filler other than the scale-like carbon material in the heat conduction film is preferably 5 to 95 mass %, more preferably 15 to 85 mass %, and still more preferably 25 to 75 masss.

Examples of the thickener include cellulose nanofiber (CNF) (such as carboxymethylated cellulose nanofiber), polyvinylpyrrolidone (PVP), sodium alginate, polyacrylic acid, polyacrylamide, carboxymethyl cellulose (CMC), hydroxypropylmethyl cellulose (HPMC), starch, xanthan gum, pectin, and the like.

The content of the thickener in the heat conduction film is not particularly limited, but is preferably 1 to 60 mass %, more preferably 5 to 50 mass %, and still more preferably 10 to 40 mass % with respect to 100 mass % of the total amount of the constituents of the heat conduction film.

[Structure of Heat Conduction Film]

As illustrated in FIG. 1, the heat conduction film according to the present aspect needs to have a structure in which adjacent scale-like carbon materials are in contact with each other. This is because when the adjacent scale-like carbon materials are in contact with each other as described above, high thermal conductivity in the plane direction of the heat conduction film can be realized. Ideally, all the scale-like carbon materials included in the heat conduction film are preferably in contact with the adjacent scale-like carbon materials, but not all the scale-like carbon materials need to be in contact with the adjacent scale-like carbon materials. In a preferred embodiment of the present embodiment, when a cross section perpendicular to the plane direction of the heat conduction film is observed, it is preferable that the scale-like carbon material is connected to the adjacent scale-like carbon material, and thus a thermally conductive network is formed from one end to another end of the heat conduction film in the plane direction. In quantitatively expressing this description, preferably 10% or more, more preferably 20% or more, still more preferably 30% or more, particularly preferably 40% or more, and most preferably 50% or more of particles of the scale-like carbon material contained in the heat conduction film are in contact with the adjacent scale-like carbon materials.

The heat conduction film according to the present aspect is also characterized in that, as illustrated in FIG. 1, the scale-like carbon material is disposed such that a long axis of the scale-like carbon material is oriented in a plane direction of the film. Here, the "long axis of the scale-like carbon material" means an axis directed in an arbitrary direction on the XY plane surface described above, and corresponds to an axis in the XY plane surface direction in a cross section perpendicular to the plane direction of the heat conduction film. In the present specification, whether or not the scale-like carbon material is disposed such that the long axis of the scale-like carbon material is oriented in the plane direction of the film is determined from the value of "orientation rate" measured in the section of Examples described later. Specifically, when the value of the orientation rate is less than 45°, the requirement that "the scale-like carbon material is disposed such that the long axis of the scale-like carbon material is oriented in the plane direction of the film" is satisfied. The value of the orientation rate is not particularly limited as long as it is less than 45°, but is preferably 44.5° or less, more preferably 44° or less, still more preferably 43.5° or less, yet still more preferably 43° or less, particularly preferably 42.5° or less, and most preferably 42° or less. When the value of the orientation rate is within these ranges, sufficiently excellent thermal conductivity in the plane direction can be achieved. Meanwhile, the lower limit of the orientation rate is not particularly limited, and is ideally 0°. However, the orientation rate substantially takes a value larger than 0° due to the overlapping of the scale-like carbon materials. From the viewpoint of ease of production, the lower limit of the orientation rate is preferably 3° or more.

Here, the thermal conductivity of the air is very low. Accordingly, it is preferable that the heat conduction film according to the present aspect does not contain much air. When this is quantitatively expressed, in the heat conduction film according to the present aspect, a proportion of voids in a cross section perpendicular to the plane direction of the film is preferably 20% or less, more preferably 19% or less, still more preferably 18% or less, particularly preferably 17% or less, and most preferably 16% or less as a value per unit area. Meanwhile, the lower limit of the proportion of voids is not particularly limited, but is usually 5% or more. In the present specification, as the value of the proportion of voids described above, the value of "void rate" measured in the section of Examples described later is adopted.

Furthermore, the heat conduction film according to the present aspect is also characterized in that at least a part of the minor diameter of the binder or the minor diameter of the void formed by the scale-like carbon material and the binder is smaller than the minor diameter of the scale-like carbon material. Here, the "minor diameter" of the binder means, when the maximum distance between any two points on a contour line specifying a region of the binder portion observed in an SEM observation image of a cross section perpendicular to the plane direction of the heat conduction film, the image being acquired when measuring the "void rate" in the section of Examples described later, is defined as a major diameter, the maximum distance in the region of the binder portion in a direction perpendicular to the major diameter. The minor diameter of the void is also defined in the same manner as above. As described above, in the present aspect, at least a part of the minor diameter of the binder or the minor diameter of the void only needs to be smaller than the minor diameter of the scale-like carbon material. However, at least a part of the minor diameter of the binder and the minor diameter of the void is preferably smaller than the minor diameter of the scale-like carbon material. Among the binders observed in the SEM observation image, a proportion of binders having a minor diameter smaller than the minor diameter of the scale-like carbon material is preferably 70% or more, more preferably 75% or more, still more preferably 80% or more, yet still more preferably 85% or more, particularly preferably 90% or more, and most preferably 95% or more. Similarly, among the voids observed in the SEM observation image, a proportion of areas of voids having a minor diameter smaller than the minor diameter of the scale-like carbon material to the total area of voids is preferably 70% or more, more preferably 75% or more, still more preferably 80% or more, yet still more preferably 85% or more, particularly preferably 90% or more, and most preferably 95% or more. According to the configuration satisfying these definitions, there is an advantage that the action and effect according to the present aspect can be more remarkably exhibited.

The film thickness of the heat conduction film according to the present aspect is not particularly limited, and can be appropriately determined according to desired thermal conductivity with respect to the heat conduction film, or the size, physical properties, and the like of a heat conduction film-forming surface of a support, a heat source or the like on which the heat conduction film is formed. As an example, the film thickness of the heat conduction film according to the present aspect is preferably 10 to 200 μm, more preferably 15 to 100 μm, and still more preferably 20 to 50 μm.

The thermal conductivity of the heat conduction film according to the present aspect in the plane direction is also not particularly limited, but is preferably 57 W/m·K or more, more preferably 60 W/m·K or more, still more preferably 63 W/m·K or more, and particularly preferably 65 W/m·K or more. Meanwhile, the upper limit of the thermal conductivity in the plane direction is not particularly limited, and usually it is preferably as high as possible, but is, for example, 1500 W/m·K or less. In the present specification, as the value of the thermal conductivity in the plane direction of the heat conduction film, a value measured by a method described in the section of Examples described later is adopted.

<<Method of Producing Heat Conduction Film>>

The method for producing the heat conduction film according to the present aspect is not particularly limited, and a production method capable of realizing the heat conduction film having the above-described structure, specifically, capable of disposing the scale-like carbon materials to be in contact with each other and to be oriented in the surface direction of the film and of controlling a relationship among the minor diameter of the binder, the minor diameter of the void, and the minor diameter of the scale-like carbon material can be appropriately adopted.

When the heat conduction film according to the present aspect is produced, a coating slurry is usually prepared by dispersing a scale-like carbon material and a binder, and other components (such as a thermally conductive filler other than the scale-like carbon material, and a thickener) which are added as necessary in an appropriate solvent. Then, the coating slurry is applied onto an appropriate support to form a coating film, and the coating film is dried and fired to produce the heat conduction film according to the present aspect on the support. Here, the support is not particularly limited. Usually, a foil-like or plate-like metal can be used. Further, as long as the coating film can withstand the heating temperature during drying or firing, the heat conduction film according to the present aspect may be used to produce the heat conduction film according to the present aspect directly on the surface of a heat source or the like that is intended to achieve heat dissipation.

Water is usually used as a solvent in producing the coating slurry. The composition of the coating slurry is not particularly limited, and the composition of the coating slurry may be determined in consideration of the above-described value as the content of the solid in the heat conduction film. The amount of the solvent may also be appropriately determined as an amount at which the solid content is sufficiently dispersed and the coatability during coating is sufficiently secured.

Examples of the coating means capable of realizing the structure unique to the heat conduction film according to the present aspect as described above include a die coater, an applicator, electrostatic coating, and the like. Here, for example, in a case where the coating slurry is applied using a die coater, the scale-like carbon material contained in the coating slurry is oriented in a certain direction when the coating slurry is supplied at a certain flow rate from a manifold of the die and passes through a slit located at the tip of the die. Next, the coating slurry discharged from the tip of the slit, in adhering to a coating film-forming surface of a support or the like, is pressurized in a direction perpendicular to the coating film-forming surface by the tip of the slit. As a result of the behavior thereof, in the coating film including the coating slurry applied using the die coater, the scale-like carbon material is oriented in the plane direction of the coating film. Further, the coating slurry passes through the gap, as a result of which voids in the coating film are crushed, and the amount of voids is reduced. Furthermore, in a case where the coating slurry contains a binder, the coating slurry passes through the gap, and thus aggregation of the binder is also suppressed. Then, since this three-dimensional structure is maintained even after subsequent drying and firing, the finally produced heat conduction film has the above-described characteristics.

When the coating slurry is applied using the applicator, a predetermined amount of the coating slurry is first disposed on a coating film-forming surface of a support or the like. Next, the applicator is moved such that the coating slurry passes through a gap between the applicator and the coating film-forming surface (this gap width specifies the film thickness of the coating film), and thus a coating film having a uniform film thickness can be formed on the coating film-forming surface. At this time, the scale-like carbon material contained in the coating slurry is oriented in the plane direction of the coating film when the slurry passes through the gap between the applicator and the coating film-forming surface. Further, the coating slurry passes through the gap, as a result of which voids in the coating film are crushed, and the amount of voids is reduced. Furthermore, in a case where the coating slurry contains a binder, the coating slurry passes through the gap, and thus aggregation of the binder is also suppressed. Since the three-dimensional structure in the coating film in each case is maintained even after subsequent drying and firing, the finally produced heat conduction film has the above-described characteristics.

Moreover, when the coating slurry is applied using electrostatic coating, for example, a large number of negatively charged droplets of fine particles of the slurry are sprayed onto the positively charged coating film-forming surface. Here, when the droplets collide with the coating film-forming surface, the scale-like carbon material is oriented in the plane direction of the coating film-forming surface by electrostatic forces. Further, when the droplets collide with the coating film-forming surface, the voids in the coating film are crushed by the pressure applied to the droplets, and the amount of the voids is reduced. Furthermore, in a case where the coating slurry contains a binder, aggregation of the binder is also suppressed by the pressure applied to the droplets when the droplets collide with the coating film-forming surface. Since the three-dimensional structure in the coating film in each case is maintained even after subsequent drying and firing, the finally produced heat conduction film has the above-described characteristics.

<<Application of Heat Conduction Film (Heat-Dissipating Structure)>>

The heat conduction film according to one aspect of the present invention described above has excellent thermal conductivity in the plane direction. Therefore, the heat-dissipating structure can be configured using the excellent thermal conductivity in the plane direction. Hence, according to another aspect of the present invention, there is provided a heat-dissipating structure including: a heat source; and the above-described heat conduction film according to the aspect of the present invention, which is disposed in contact with the heat source. Hereinafter, the heat-dissipating structure according to the present aspect will be described with reference to the drawings by taking, as an example, a heat-dissipating structure for dissipating heat generated from a high-luminance light-emitting diode (LED) as a heat source.

In recent years, a high-luminance light-emitting diode (LED) lamp has been adopted for extension of the lifetime of headlights for automobiles and power saving thereof, and a heat sink has been used for cooling the high-luminance LED. Usually, the heat sink includes a metal material having high thermal conductivity such as pure aluminum or an aluminum alloy, and has a shape in which a plurality of fins is arranged in a row on a flat heat-receiving surface by die casting or the like.

FIG. 3 is a schematic cross-sectional view schematically illustrating a cross section of a heat-dissipating structure according to such a conventional technique.

As illustrated in FIG. 3, a heat-dissipating structure 1 according to the conventional technique is used for cooling, for example, a high-luminance LED module 4 having an output of 1 W or more, and has a basic configuration in which a heat-transfer plate 3 including at least a good thermal conductor metal or a carbon material and a heat sink body 2 including a thermally conductive resin are combined. Further, the LED module 4 has a structure in which an emitter 8 is held in the central portion of a substrate 7, the emitter including a plurality of LED elements incorporated and a lens integrally formed. The substrate 7 is joined to a heat-receiving surface 5 disposed on the heat sink body 2 described above. In the heat-dissipating structure 1 illustrated in FIG. 3, heat generated from a narrow heat source by driving the LED module 4 is transferred to the entire heat-receiving surface 5 through the heat-transfer plate 3 including a good thermal conductor metal or a carbon material, the plate being provided along the heat-receiving surface 5 to which the LED module 4 is joined. The heat is dissipated into the air by the heat sink body 2 molded from a thermally conductive resin having a low heat capacity and a high emissivity, thereby suppressing a temperature rise of the LED module 4 (i.e., the LED module 4 is cooled). According to the heat-dissipating structure 1 having such a configuration, it is possible to dissipate the heat generated from the LED module 4 to some extent. However, the heat sink body 2 occupies a large volume in the heat-dissipating structure 1, and this causes a problem that space efficiency is poor. In addition, the heat sink body 2 includes a metal material such as pure aluminum or an aluminum alloy, and thus, when the heat-dissipating structure 1 is used for, for example, a headlight for an automobile, the heat-dissipating structure 1 also becomes a factor of increasing the weight of the automobile.

Meanwhile, FIG. 4 is a schematic cross-sectional view schematically illustrating a cross section of a heat-dissipating structure according to one aspect of the present invention.

As illustrated in FIG. 4, in the heat-dissipating structure 1 according to one aspect of the present invention, the heat sink body 2 is removed as compared with the heat-dissipating structure illustrated in FIG. 3. Meanwhile, the heat conduction film 10 (see FIG. 1) according to one aspect of the present invention is disposed to cover the entire surface of the heat-transfer plate 3 on the side where the LED module 4 is disposed. With such a configuration, the heat-dissipating structure 1 according to the embodiment illustrated in FIG. 4 can quickly transmit heat generated from a narrow heat source by driving the LED module 4 in the plane direction of the heat conduction film 10 and efficiently dissipate the heat to the outside. In addition, the heat sink body included in the heat-dissipating structure according to the embodiment illustrated in FIG. 3 is not included, and thus there is an extremely excellent advantage that the volume and weight of the heat-dissipating structure can be greatly reduced.

Although not illustrated in FIG. 4, in the heat-dissipating structure 1, it is preferable that a heat dissipator is further disposed in contact with heat conduction film 10. Such a heat dissipator is disposed, as a result of which more efficient heat dissipation can be realized. Note that the term "heat dissipator" as used herein means a member that can more efficiently release the heat conducted from the heat source (the LED module 4 in FIG. 4) to the outside through the heat conduction film 10. Examples of the heat dissipator include a heat pump and a metal housing of an electronic device, in addition to the heat sink. Further, when a heat dissipator is further disposed on the heat conduction film 10, from the viewpoint of sufficiently utilizing the excellent thermal conductivity of the heat conduction film 10 in the plane direction, the heat dissipator is preferably disposed at a position not facing the heat source with the heat conduction film interposed therebetween, the heat conduction film being disposed in contact with the heat source (i.e. the heat source and the heat dissipator are separated from each other in the plane direction of the heat conduction film). At this time, the distance between the heat source and the heat dissipator in the plane direction of the heat conduction film is preferably 1 cm or more, more preferably 5 cm or more, still more preferably 10 cm or more, particularly preferably 15 cm or more, and most preferably 20 cm or more.

As described above, the heat-dissipating structure according to one aspect of the present invention has been described by exemplifying the heat-dissipating structure having a high-luminance light-emitting diode (LED) as a heat source. However, the heat-dissipating structure according to the present aspect is not limited thereto, and can be used for the purpose of dissipating heat generated in various heat sources.

Examples of such a heat source include, in addition to the above-described LED module, various lasers (sensors) (the conventional heat-dissipating means is an aluminum plate or a combination of the aluminum plate and a cooling fin, a Peltier device, or chiller water cooling); a high-performance infrared camera (IR) (the conventional heat-dissipating means is an aluminum plate or a combination of the aluminum plate and a cooling fin, a Peltier element, or chiller water cooling); a head-up display (HUD) (the conventional heat-dissipating means is a combination of a heat sink and a spreader); an element and a battery of a smartphone (the conventional heat-dissipating means includes air cooling, a heat dissipating sheet, and a combination of a heat sink and a spreader); an element and a battery of a digital camera (the conventional heat-dissipating means is a combination of a heat sink, a spreader, and a housing); an element and a battery of a personal computer (PC) (the conventional heat dissipating means is a combination of a fan, a heat sink, a spreader, and a housing); an element of an electronic control unit (ECU) for vehicle or the like (the conventional heat-dissipating means is a combination of a heat sink, a spreader, and a casing); an element of an insulated gate bipolar transistor (IGBT) which is a main conversion element of a high-power inverter (the conventional heat-dissipating means is a combination of a heat sink, a spreader, and a housing); a rotating portion of a motor (the conventional heat-dissipating means is a combination of a fan and a heat sink or a combination of a fan and a heat sink and water cooling); a light source lamp of a thin display (the conventional heat-dissipating means is a heat sink); an on-vehicle large-capacity battery (the conventional heat-dissipating means is a heat-dissipating sheet, a heat-dissipating material, or a combination of air cooling or water cooling, a fan, and a heat sink), and the like.

The heat-dissipating structure according to the present aspect is applied to these heat sources, and thus it is possible to replace the heat-dissipating means conventionally applied to each heat source with the heat conduction film according to one aspect of the present invention. As a result, for example, as described with reference to FIG. 4, when the heat sink as the conventional heat-dissipating means can be removed, the weight and volume of the heat-dissipating structure can be greatly reduced. Further, the conventional heat-dissipating means (such as a fan, air cooling, or water cooling) is replaced with the heat conduction film according to one aspect of the present invention, whereby it is expected that the weight and volume of the heat-dissipating structure can be largely reduced as compared with the heat-dissipating structure including the conventional heat-dissipating means.

EXAMPLES

Hereinbelow, the present invention will be described in more detail with reference to Examples. However, the technical scope of the present invention is not limited to the following Examples.

Production Example of Heat Conduction Film

Example 1

Predetermined amounts of commercially available graphene (containing multi-layer graphene, manufactured by Kanto Chemical Co., Inc.) and vapor grown carbon fiber (VGCF, manufactured by Showa Denko K.K.) were weighed, and the weighed materials were stirred for 1 minute at a rotation speed of 2000 rpm using a stirrer (planetary centrifugal propeller-less mixer) to obtain a carbon material mixture.

Next, a predetermined amount of pure water was weighed, the weighed water was added to the carbon material mixture obtained above, and then the resulting mixture was stirred at a rotation speed of 2000 rpm for 1 minute using the stirrer.

Meanwhile, a predetermined amount of styrene-butadiene rubber (SBR, manufactured by JSR Corporation) was weighed as a binder, the weighed rubber was added to the carbon material mixture mixed with pure water as described above, and then the resulting mixture was stirred for 1 minute at a rotation speed of 2000 rpm using the stirrer.

Subsequently, a predetermined amount of carboxymethyl cellulose nanofiber (carboxymethylated cellulose nanofiber (CNF), manufactured by Nippon Paper Industries Co., Ltd.) was weighed, the weighed nanofiber was added to the carbon material mixture mixed with the binder as described above, and then the resulting mixture was stirred for 1 minute at a rotation speed of 2000 rpm using the stirrer.

Then, a predetermined amount of pure water was weighed, the weighed water was added to the carbon material mixture mixed with the carboxymethylated cellulose nanofiber (CNF) as described above, and then the resulting mixture was stirred at a rotation speed of 2000 rpm for 1 minute using the stirrer to obtain a coating slurry. A ratio (mass %) of components in the coating slurry thus obtained was as follows: graphene:VGCF:binder:carboxymethylated cellulose nanofiber (CNF):pure water=5:7.5:3.75:8.75:75 (i.e., a ratio (mass %) of components as solids was as follows: graphene:VGCF:binder:carboxymethylated cellulose nanofiber (CNF)=20:30:15:35).

As a support for forming a heat conduction film, an aluminum foil (film thickness: 20 μm) was provided. Next, the coating slurry obtained as described above was coated on one surface of the support using a die coater (self-propelled coater) to form a coating film (film thickness: 30 μm) formed of the coating slurry, thereby obtaining a laminated body including the support and the coating film.

Thereafter, the laminated body obtained above was left to stand still on a hot plate at 40° C. for 30 minutes, and the coating film was dried. Then, this laminated body was further left to stand still in an electric furnace at 130° C. for 30 minutes, and the coating film was fired to produce a heat conduction film (film thickness: 30 μm) of this Example on the surface of the support.

Comparative Example 1

The coating slurry obtained in Example 1 described above was applied to one surface of a support (aluminum foil) which was the same as that used in Example 1 using a spray gun (manufactured by ANEST IWATA Corporation) to form a coating film (film thickness: 30 μm) formed of the coating slurry, thereby obtaining a laminated body including the support and the coating film.

Thereafter, the laminated body obtained above was left to stand still on a hot plate at 40° C. for 30 minutes, and the coating film was dried. Then, this laminated body was further left to stand still in an electric furnace at 130° C. for 30 minutes, and the coating film was fired to produce a heat conduction film (film thickness: 30 μm) of this Comparative Example on the surface of the support.

Comparative Example 2

The coating slurry obtained in Example 1 described above was transferred to another container, and a support (aluminum foil) which was the same as that used in Example 1 was immersed in the coating slurry. Then, the immersed support was pulled up from the coating slurry and then held for 1 minute to remove the excess coating slurry, and a coating film formed of the coating slurry was formed on the surface of the support. After that, the sample thus obtained was left to stand still in an electric furnace at 60° C. for 5 minutes, and the coating film was dried.

Thereafter, the sample obtained as described above was placed from a direction opposite to the above direction and immersed in the coating slurry. Then, the immersed support was pulled up from the coating slurry and then held for 1 minute to remove the excess coating slurry, and a coating film formed of the coating slurry was again formed on the surface of the support. After that, the sample thus obtained was left to stand still in an electric furnace at 60° C. for 5 minutes, and the coating film was dried.

Thereafter, the sample obtained as described above was left to stand still in an electric furnace at 130° C. for a further 30 minutes, and the coating film was fired to produce a heat conduction film (film thickness: 30 μm) of this Comparative Example on the surface of the support.

Evaluation Example of Heat Conduction Film

[Measurement of Orientation Rate of Scale-like Carbon Material in Heat Conduction Film]

With regard to the heat conduction films produced in the Example and Comparative Examples described above, the orientation rate of the scale-like carbon material (graphene) was evaluated by a method described below. The results are shown in Table 1 below.

Specifically, a pole figure of a graphite (002) plane inside the heat conduction film was measured using a micro-spot X-ray diffraction analyzer. At this time, the longitudinal direction (MD) and width direction (TD) of the heat conduction film in the obtained pole figure were defined, the half width of the diffraction intensity peak was calculated from a cross-sectional profile of the pole figure in the width direction (TD), and the resulting value was used as the orientation rate. The measurement of the half width of the diffraction intensity peak is performed using such a pole figure while an incident angle θ in the X-ray diffraction measurement is changed within a range of 0 to 90°, whereby the orientation rate can be calculated by the following mechanism. Hence, when the orientation of the scale-like carbon material (graphene) is random, the scale-like carbon material (graphene) corresponding to each incident angle θ uniformly exists, and thus the diffraction intensity peak is broad (flat). Meanwhile, when the orientation of the scale-like carbon material (graphene) is aligned in a specific direction, the diffraction intensity is detected biased to the incident angle θ of a specific region, and thus the diffraction intensity peak becomes sharp. In this measurement method, the smaller the value of the orientation rate, the higher the degree of orientation of the long axis of the scale-like carbon material (graphene) in the plane direction of the heat conduction film. Further, in Table 1 below, the fact that the orientation rate is described as "random" means that the value of the orientation rate could not be calculated by the above method because the orientation of the scale-like carbon material is random.

[Measurement of Void Rate of Heat Conduction Film (Proportion of Voids in Cross Section Perpendicular to Plane direction)]

The void rate (proportion of voids in the cross section perpendicular to the plane direction) of each of the heat conduction films produced in the Example and Comparative Examples described above was measured by a method described below. The results are shown in Table 1 below.

Specifically, the cross section perpendicular to the plane direction of the heat conduction film was observed using a scanning electron microscope (SEM), and the area of voids present in an observation visual field of 20 μm×20 μm in the obtained SEM observation image was measured. Then, the void rate was calculated as a percentage of the area of voids measured in the above-described manner to the area of the observation visual field (area of voids/area of observation visual field×100 [%]). An ion milling treatment was performed as a preparation treatment of the cross section used for SEM observation.

Here, according to SEM observation of the heat conduction film produced in Example 1, it was confirmed that adjacent graphenes (scale-like carbon materials) were in contact with each other. In addition, from the SEM observation, it was also confirmed that the minor diameter of the binder was mostly smaller than the minor diameter of the graphene, and the minor diameter of the void formed by the graphene and the binder was mostly smaller than the minor diameter of the graphene.

[Evaluation of Thermal Conductivity]

The thermal conductivity of each of the heat conduction films produced in the Example and Comparative Examples described above was evaluated by a method described below. The results are shown in Table 1 below.

First, each of the heat conduction films (each having a support) was cut into a strip shape of 150 mm×20 mm to produce a sample for evaluation of thermal conductivity.

A heat source (output: 2 W) was disposed at one end of the evaluation sample produced above. At this time, thermocouples were disposed at three locations on the surface of the evaluation sample. As for the locations of the thermocouples, the central portion of the heat source (between the heat source and the heat conduction film) was defined as a first location, and locations of 25 mm and 50 mm from the first location in the longitudinal direction of the evaluation sample were defined as a second location and a third location, respectively.

The evaluation sample with the thermocouples disposed thereon was left to stand still in a thermostat bath at 25° C. Then, the switch of the heat source was turned on to apply heat to the heat conduction film from the heat source, and the temperature profile of the thermocouples was acquired. At this time, heating was continued until the temperature of the thermocouples was stabilized, and the temperature at each measurement point when the temperature of the thermocouples was stabilized was acquired. Then, based on the temperature measured in the above-described manner, the thermal conductivity of the heat conduction film was calculated according to the following calculation formula of thermal conductivity. Note that, as a distance [m], a distance (50 mm (=0.05 [m]) between the thermocouple at the first location and the thermocouple at the third location was used. Further, as a cross-sectional area [$m^2$], a cross-sectional area (20 mm×30 μm (=$6\times10^{-7}$[m])) of the heat conduction film was used. Then, as a temperature difference [K], a temperature difference between the thermocouple at the first location and the thermocouple at the third location was used.

(Calculation Formula of Thermal Conductivity)

$$\text{Thermal conductivity [W/m} \cdot \text{K]} = \text{heat transfer amount [W]} \times \text{distance [m]} \times \text{(1/cross-sectional area [m}^2\text{])} \times \text{(1/temperature difference [K])}$$

TABLE 1

| | Production method | Binder Ratio of components (mass %) | Orientation rate [°] | Void rate [%] | Thermal conductivity [W/m · K] |
|---|---|---|---|---|---|
| Example 1 | Die coater | 15 | 42 | 15.4 | 65.0 |
| Comparative Example 1 | Spray gun | 15 | Random | 23.6 | 53.7 |

TABLE 1-continued

| | Production method | Binder Ratio of components (mass %) | Orientation rate [°] | Void rate [%] | Thermal conductivity [W/m · K] |
|---|---|---|---|---|---|
| Comparative Example 2 | Immersion method | 15 | Random | 25.3 | 56.0 |

From the results shown in Table 1, it can be seen that the heat conduction film of Example 1 according to one aspect of the present invention has a configuration in which the scale-like carbon materials (graphenes) adjacent to each other are disposed in contact with each other and the long axis of the scale-like carbon material is oriented in the plane direction of the film, and thus the thermal conductivity in the plane direction is very high. On the other hand, it is found that the heat conduction films of the Comparative Examples are not configured such that the long axis of the scale-like carbon material (graphene) is oriented in the plane direction of the film, and as a result, the films are inferior in thermal conductivity.

REFERENCE SIGNS LIST

10 Heat conduction film
100 Multi-layer graphene (scale-like carbon material)
200 Styrene-butadiene rubber (SBR) (binder)

The invention claimed is:

1. A heat conduction film comprising:

scale-like carbon material members, each comprising a plurality of graphene layers; and a resin binder, wherein:

adjacent scale-like carbon material members are in contact with each other and are disposed such that long axes of the scale-like carbon material members are oriented in a plane direction of the film, and a minor diameter of the resin binder or a minor diameter of a void formed by the scale-like carbon material members and the resin binder is smaller than a minor diameter of the scale-like carbon material members, and the scale-like carbon material members are exposed at a top surface of the film or a bottom surface of the film.

2. The heat conduction film according to claim 1, wherein at least a part of the minor diameter of the resin binder is smaller than the minor diameter of the scale-like carbon material members, and a proportion of a number of resin binders having a minor diameter smaller than the minor diameter of the scale-like carbon material members is 70% or more.

3. The heat conduction film according to claim 1, wherein a content of the resin binder is less than 50 mass %.

4. The heat conduction film according to claim 3, wherein a content of the resin binder is 1 to 40 mass %.

5. The heat conduction film according to claim 4, wherein a content of the resin binder is 5 to 30 mass %.

6. The heat conduction film according to claim 1, wherein the scale-like carbon material members comprise graphene of graphite.

7. The heat conduction film according to claim 1, wherein an orientation rate of the scale-like carbon material members is 42° or less.

8. The heat conduction film according to claim 1, wherein a proportion of voids in a cross section perpendicular to the plane direction of the heat conduction film is 20% or less per unit area.

9. The heat conduction film according to claim 1, wherein a proportion of voids in a cross section perpendicular to the plane direction of the heat conduction film is 5% or more per unit area.

10. The heat conduction film according to claim 1, wherein, when a cross section perpendicular to the plane direction of the heat conduction film is observed, adjacent scale-like carbon material members are connected, and thus a thermally conductive network is formed from one end to another end of the heat conduction film in the plane direction.

11. A heat-dissipating structure comprising:

a heat source; and the heat conduction film according to claim 10, which is disposed in contact with the heat source.

12. The heat-dissipating structure of claim 11, wherein a heat dissipator is further disposed in contact with the heat conduction film.

13. The heat-dissipating structure according to claim 12, wherein the heat dissipator is disposed at a position not facing the heat source with the heat conduction film interposed therebetween.

* * * * *